United States Patent
Chou et al.

(10) Patent No.: US 7,168,842 B2
(45) Date of Patent: Jan. 30, 2007

(54) LIGHT EMITTING DIODE BACKLIGHT PACKAGE

(75) Inventors: Shen-hong Chou, Kaohsiung (TW); Hui-Kai Chou, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 120 days.

(21) Appl. No.: 11/000,372

(22) Filed: Dec. 1, 2004

(65) Prior Publication Data

US 2006/0114693 A1   Jun. 1, 2006

(51) Int. Cl.
*F21V 7/04* (2006.01)
(52) U.S. Cl. ............... 362/631; 362/294; 362/373; 362/555; 362/612; 362/621; 362/800; 257/99
(58) Field of Classification Search ......... 362/294, 362/373, 457, 458, 611–614, 621, 630, 631, 362/634, 800, 370, 555; 257/99
See application file for complete search history.

(56) References Cited

U.S. PATENT DOCUMENTS

| | | | |
|---|---|---|---|
| 5,381,309 A * | 1/1995 | Borchardt | 362/612 |
| 6,508,564 B1 * | 1/2003 | Kuwabara et al. | 362/612 |
| 2001/0030866 A1 * | 10/2001 | Hochstein | 362/294 |

* cited by examiner

*Primary Examiner*—Stephen F Husar
*Assistant Examiner*—Meghan K. Dunwiddie
(74) *Attorney, Agent, or Firm*—Arent Fox PLLC

(57) ABSTRACT

In a light emitting device including a transparent covering, a fastener having a vertical member and a horizontal member, a light-emitting chip disposed on one face of the vertical member and encased by the transparent covering, a circuit board disposed on one face of the horizontal member, at least one conductive means connecting the light-emitting chip to the circuit board, and at least one heat-dissipating plate perpendicularly disposed on the other face of the horizontal member, light may be emitted longitudinally along a light-guiding plate, thus optimizing the travel path of the emitted light, while maintaining a compact shape by enabling placement of the printed circuit board and heat dissipating plates away from a longitudinal axis of the light-guiding plate.

9 Claims, 3 Drawing Sheets

CONVENTIONAL ART

CONVENTIONAL ART

LIGHT EMITTING DIODE BACKLIGHT PACKAGE

BACKGROUND OF THE INVENTION

1. Field of the Invention

The present invention generally relates to the packaging of light-emitting device backlights. In particular, the present invention relates to a light-emitting device backlight package which requires minimal space while producing maximum luminosity.

2. Related Art

Liquid crystal displays (LCDs) are commonly used in televisions, computers, and cellular telephones to display information to their users. The most basic function of the LCD is to act as a light switch, allowing transmission of light in one mode and blocking transmission of light in a second mode. The LCD selectively modulates light from a backlight or a reflector (or a combination of both), with these modes being referred to as transmissive mode and reflective mode, respectively. Backlighting the LCD is a popular method of providing a light source for the LCD, since backlighting the LCD allows good functionality in low ambient light conditions and also provides enhanced contrast ratios. However, since conventional LCDs do not have high transmissivities (with most being less than 50% transmissive), it is important that the backlight be as efficient as possible.

There are currently a variety of backlight devices that are utilized and proposed. Important factors in the design of these devices are the configuration and their associated printed circuit boards (PCBs) relative to the light guiding plate (LGP). LED backlight devices currently available are typically of two types, which are shown in FIGS. 1 and 2.

FIG. 1 illustrates a conventional LED backlight package. In FIG. 1, the LED modules 10 are shown in a conventional configuration, i.e., they are placed at the bottom of an LGP 11, at each of the two ends of the LGP 11. Each LED module 10 emits light via a ray 12 toward the top of the LGP 11 enclosure, which then reflects as ray 13 to the end of the LGP 11 enclosure closest to the LED module 10, and then reflects back along ray 14 to travel along the length of the LGP 11. For this conventional example, the emitted light must encounter two reflections prior to traveling the length of the LGP 11. For each of these reflections, energy losses are incurred due to the native imperfect reflectivity of the surfaces. These energy losses, in addition to the inherent inefficiencies they introduce, also lead to poor luminosity along the length of the LGP 11. This situation is clearly undesirable and methods have been sought to solve these problems.

FIG. 2 illustrates another example of a conventional LED backlight package. This example seeks to solve the above problem of energy losses and low luminosity by placing LED modules 20 on the ends of an LGP 21. In this example, the light rays 22 emitted by the LED modules 20 travel directly along the length of the LGP 21. Since light rays 22 undergo no reflections, light transmission is improved. The result is greatly reduced energy losses, more energy efficiency and enhanced luminosity along the length of the LGP 21.

While the example of FIG. 2 is an improvement over that shown in FIG. 1, the new configuration has, however, created another drawback. For conventional LED backlights, heat-dissipating plates 23 are typically placed underneath of PCB 24 to dissipate the heat generated by the electronics away from the delicate circuitry. When this is done for the example of FIG. 2, the heat-dissipating plates 23 extend from the end of the LGP 21 in the longitudinal direction. This positioning is awkward and inefficient, causing critical space to be occupied by what is essentially a maintenance device, instead of using that space to contribute to the primary goal of achieving efficient light production.

FIG. 3 shows in greater detail a conventional LED module 30, which includes LENS 31, a chip 32 on top of fastener 33, and conductive wiring 34 connecting the chip 32 to PCB 35 underneath of the fastener 33. Additionally, heat-dissipating plates 36 are placed underneath of the PCB 35, to channel the heat generated by the electronics.

In order to overcome these problems, what is needed is a light-emitting device backlight package which achieves direct transmission of the emitted light in the longitudinal direction of an light guiding plate, while also minimizing the space required for the packaging, thus addressing and solving problems associated with conventional systems.

SUMMARY OF THE INVENTION

It is therefore a feature of an of the present invention to provide a light emitting device backlight package, which requires minimal packing space in the longitudinal direction of a light guiding plate.

It is another feature of an embodiment of the present invention to provide a light emitting device backlight package, which transmits light along the light guiding plate with minimal energy losses.

At least one of the above and other features and aspects of the present invention may be realized by providing a light emitting device backlight package having a fastener of a novel shape, which provides a first surface to which a chip and light emitting device module attach, while also providing a second surface for attachment of a second fastener, or a PCB. In this way, the light emitting device emits light longitudinally along a light guiding plate, thus optimizing the travel path of the emitted light, while maintaining a compact shape by placing the PCB and heat dissipating plates away from the longitudinal axis of the light guiding plate.

DESCRIPTION OF THE DRAWINGS

The above and other features and aspects of the present invention will become more apparent to those of ordinary skill in the art by describing in detail exemplary embodiments thereof with reference to the attached drawings in which.

DETAILED DESCRIPTION OF THE EXEMPLARY EMBODIMENTS

Figure 1:
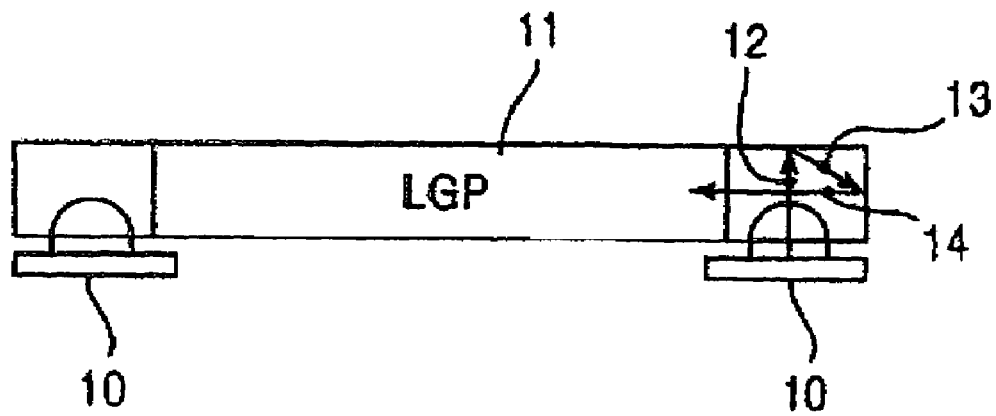
FIG. 1 illustrates a conventional LED backlight package.
Figure 2:
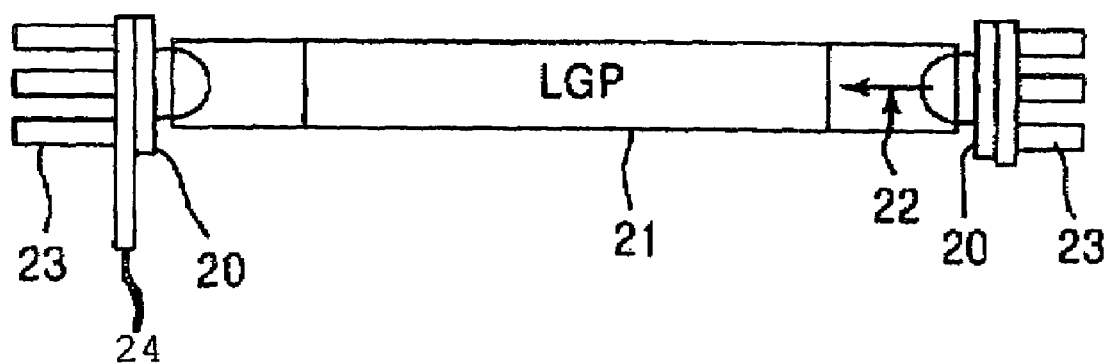
FIG. 2 illustrates a second conventional LED backlight package.
Figure 3:
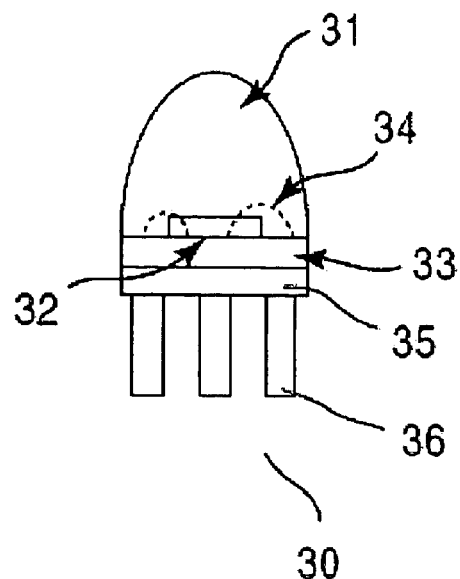
FIG. 3 illustrates a conventional LED module.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions may be exaggerated for clarity of illustration. Like reference numerals refer to like elements throughout.

Figure 4:
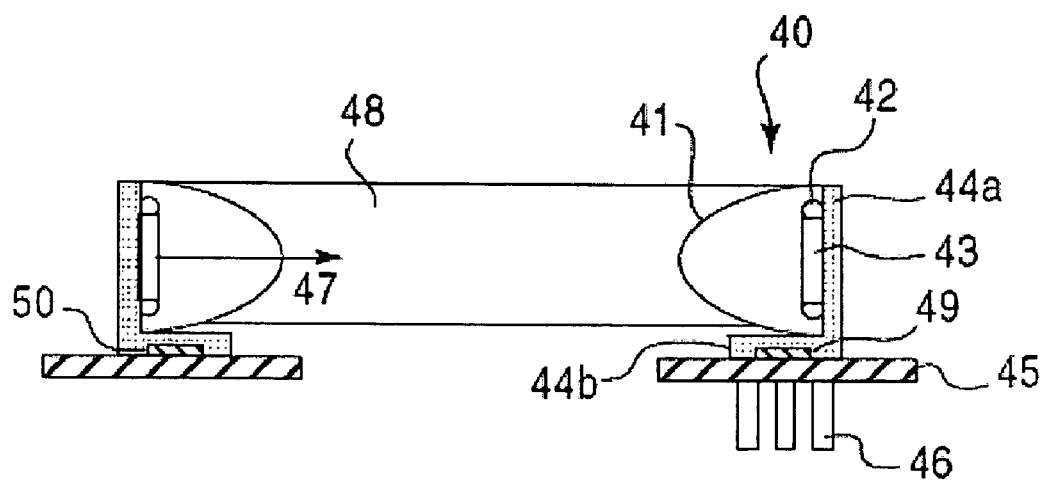
FIG. 4 illustrates a light emitting device backlight package according to an embodiment of embodiment of the present invention.

FIG. 4 illustrates a light emitting device (LED) package incorporating light emitting device (LED) modules 40, according to an embodiment of the present invention. Basic components of LED modules 40 include a LENS 41, conducting wires 42, chip 43, an L shaped fastener formed of a first portion 44A and a second portion 44B, and a PCB 45. In this exemplary embodiment, the first portion 44A and the second portion 44B of the L shaped fastener are oriented perpendicular to each other, as illustrated in FIG. 4. However, the present invention is not limited to the configuration shown in FIG. 4, and different configurations may be used without departing from the scope of the present invention. The LENS 41 may be any transparent material such as glass or plastic. The chip 43 and the PCB 45 are respectively disposed on the first and second portions 44A, 44B of the fastener 44. The conducting wire 42 runs from the vertically oriented chip 43 to the horizontally oriented PCB 45, and is connected to the anode lead 49 and the cathode lead 50 of the chip 43, respectively. Therefore, the PCB 45 is able to apply proper electric signals for light emission. In addition, heat-dissipating plates 46 are attached to the underside of the horizontally oriented PCB 45. Thus, PCB 45 is attached on one side to the second portion 44B of the L shaped fastener and on the other side to the heat-dissipating plates 46. The heat-dissipating plates 46 conduct, or dissipate, heat produced by electronic components disposed on the PCB 45.

The LED package shown in FIG. 4 includes a light guiding plate 48 having a longitudinal axis 47. The first portion 44A of the L shaped fastener extends along the lateral side of the light guiding plate 48 in a direction perpendicular to the longitudinal axis 47 of the light guiding plate 48. The second portion 44B of the L shaped fastener extends behind the light guiding plate 48 in a direction parallel to the longitudinal axis 47. The light emitting device modules 40 are respectively placed on the lateral sides of the light guiding plate 48, so that the emitted light travels directly through the light guiding plate 48 along the longitudinal axis 47.

In operation, electrical signals pass from the PCB 45 through conducting wires 42 to the chip 43. Light emitting device module 40 is thus powered to emit light, with the emitted light traveling along the longitudinal axis 47 of the light guiding plate 48, thus achieving the most efficient light transmission path.

The heat generated by the electronic components disposed on PCB 45 is dissipated through the heat-dissipating plates 46 attached to the surface of PCB 45 opposite that attached to the second portion 44B of the fastener. Thus, the embodiment of the present invention shown in FIG. 4 achieves an optimal light travel path and efficient heat dissipation, while conserving valuable space in the longitudinal direction of the light guiding plate 48.

Figure 5:
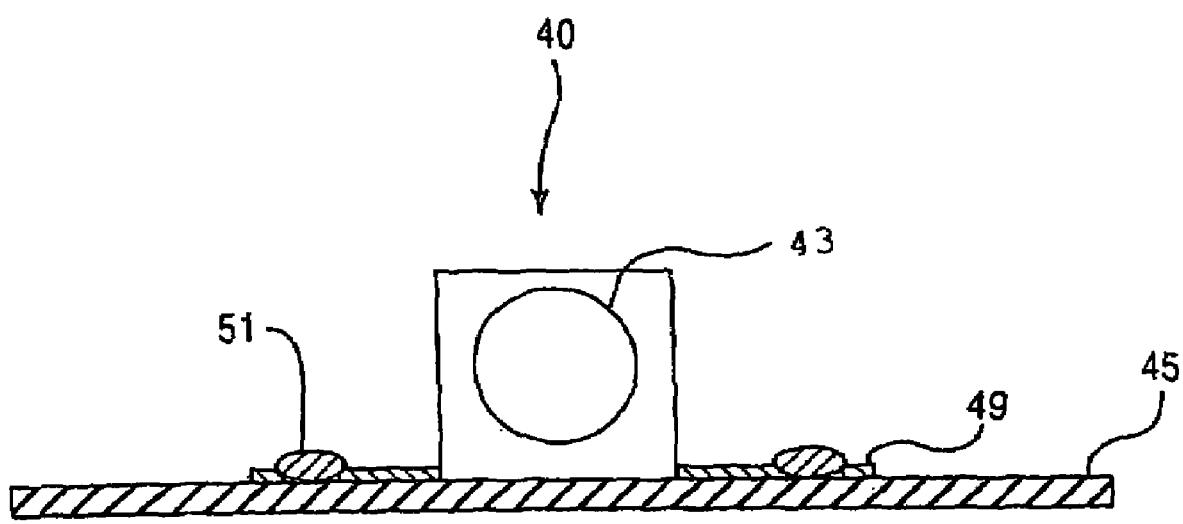
FIG. 5 illustrates a light emitting device package according to an embodiment of the present invention.

FIG. 5 illustrates a view of the LED module 40 of FIG. 4, showing the anode lead 49 attached to the PCB 45 with solder 51. Conducting wires or other conductive means may be attached to the PCB 45 with solder 51, to provide electrical communication between the PCB 45 and the chip 43. However, the present invention is not limited to the configuration shown in FIG. 5, and different configurations may be used without departing from the scope of the present invention.

By the present invention, a light emitting device backlight package includes a fastener having a first surface to which to attach a chip and a second surface for attachment of a printed circuit board. Therefore, the printed circuit board and the heat dissipating plates may be placed away from the longitudinal axis of the light-guiding plate. Accordingly, a light emitting device having a compact shape is provided, in which light is emitted longitudinally along the light-guiding plate, thereby optimizing the travel path of the emitted light.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims and their equivalents.

What is claimed is:

1. A light emitting device, comprising:
a transparent covering;
a fastener having a vertical member and a horizontal member disposed perpendicular to each other;
a light-emitting chip disposed on one face of the vertical member and encased by the transparent covering;
a circuit board disposed on one face of the horizontal member;
at least one conductive means connecting the light-emitting chip to the circuit board; and
at least one heat-dissipating plate perpendicularly disposed on the other face of the horizontal member.

2. The light emitting device as claimed in claim 1, wherein the fastener comprises a substantially L-shaped structure.

3. A backlight package comprising:
a light guiding plate having a first side;
a first fastener having a first portion and a second portion, the first portion disposed adjacent to the first side of the light guiding plate, wherein the first portion and the second portion are arranged in a substantially perpendicular relationship to form a substantially L-shaped structure; and
a light emitting device disposed on the first portion of the first fastener for emitting a light toward the light guiding plate.

4. The backlight package as claimed in claim 3, wherein the second portion extends above the light guiding plate.

5. The backlight package as claimed in claim 3, further comprising a circuit board and a conducting wire, the circuit board connecting the second portion, and the conducting wire electrically coupling the light emitting device to the circuit board.

6. The backlight package as claimed in claim 3, further comprising a circuit board and a heat dissipating means, the circuit board connecting the second portion, and the heat dissipating means attached onto the surface of the circuit board for conducting a heat generated thereon.

7. A backlight package comprising:
a light guiding plate having a first side;
a first fastener having a first portion and a second portion, the first portion extending along the first side of the light guiding plate, and the second portion extending above the light guiding plate wherein the first portion and the second portion are arranged in a substantially perpendicular relationship to form a substantially L-shaped structure;

a light emitting device disposed on the first portion of the first fastener for emitting a light toward the light guiding plate; and a circuit board connecting the second portion of the first fastener; and a conducting wire electrically coupling the light emitting device to the circuit board.

8. The backlight package as claimed in claim 7, wherein the first portion is substantially perpendicular to the second portion.

9. The backlight package as claimed in claim 7, further comprising a heat dissipating means attached onto the surface of the circuit board for conducting a heat generated thereon.

\* \* \* \* \*